United States Patent [19]
Della Bosca et al.

[11] Patent Number: 5,229,918
[45] Date of Patent: Jul. 20, 1993

[54] METAL HEAT SINK BASEPLATE FOR A SEMICONDUCTOR DEVICE

[75] Inventors: Pietro Della Bosca, Brugherio; Angelo Massironi, Concorezzo, both of Italy

[73] Assignee: SGS-Thomson Microelectronics s.r.l., Milan, Italy

[21] Appl. No.: 830,402

[22] Filed: Jan. 30, 1992

[51] Int. Cl.$^5$ .............................................. H05K 7/20
[52] U.S. Cl. ............................. 361/388; 165/185; 174/16.3; 361/386; 361/408; 361/421; 257/712
[58] Field of Search ........................ 168/80.3, 185; 174/16.3, 52.4; 357/69, 70, 81; 361/386–389, 408, 421

[56] References Cited
U.S. PATENT DOCUMENTS

| | | | |
|---|---|---|---|
| 4,132,856 | 1/1979 | Hutchison et al. | 174/52 PE |
| 4,326,215 | 4/1982 | Suzuki et al. | 357/81 |
| 4,949,220 | 8/1990 | Tashiro | 165/185 |

*Primary Examiner*—Gregory D. Thompson
*Attorney, Agent, or Firm*—Seed and Berry

[57] ABSTRACT

A metal heat sink baseplate of a resin-encapsulated semiconductor power device, onto which the semiconductor die is bonded, is provided with one or more raised portions near the perimeter of the bound area of the semiconductor die, onto which ground wires may be welded in order to increase the reliability of wire connections realized between ground connecting pads and the metallic heat sink baseplate itself. The raised portions are preferably obtained by deep drawing the metal of the baseplate. A Single-In-Line semiconductor device is shown wherein the deep drawing of the metal heat sink baseplate for realizing a ridge on the assembly face, to be used for realizing wire ground connections is formed in a separation zone between a portion of the metallic baseplate which extends beyond the perimeter of the encapsulating resin body and onto which the fastening means of an external heat sink are arranged, and the remaining part of the baseplate onto which the semiconductor die is bonded. The deep drawing performed in this zone is also instrumental in providing a mechanical decoupling between the two portions of the metallic baseplate for reducing transmission of flection stresses.

11 Claims, 1 Drawing Sheet

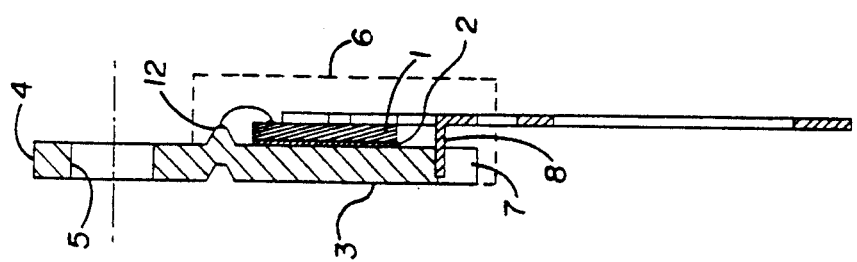
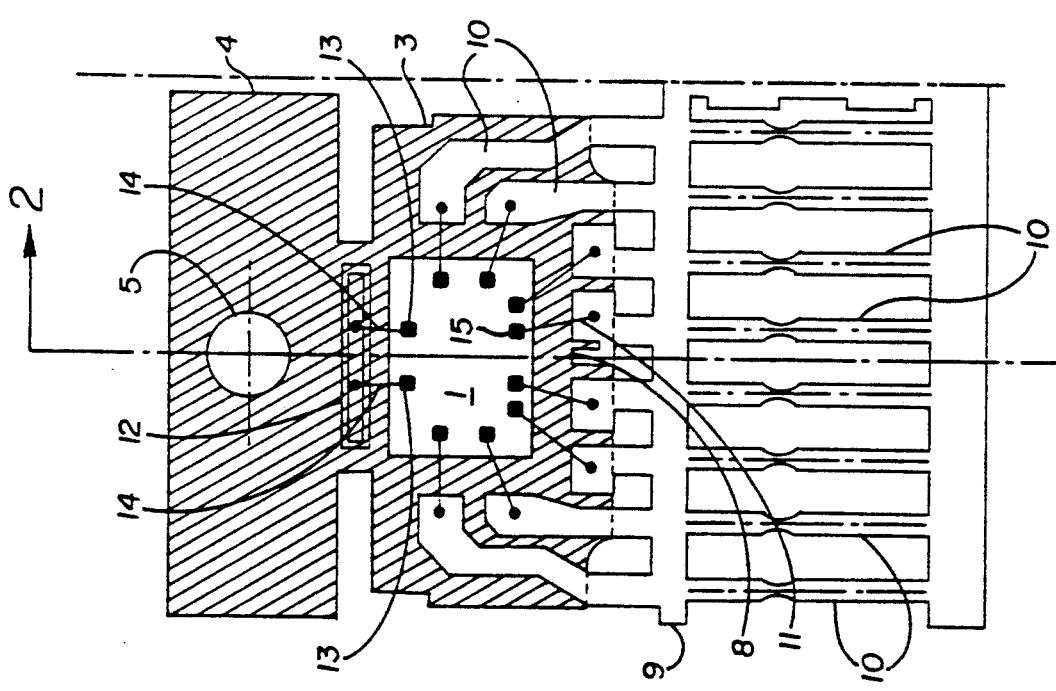

METAL HEAT SINK BASEPLATE FOR A SEMICONDUCTOR DEVICE

TECHNICAL FIELD

The present invention relates to a resin-encapsulated semiconductor device wherein the semiconductor die is directly mounted on the face of a heat sink metal baseplate, which is functionally part of an electric path between at least a pad for ground connection of the front of the semiconductor die and a pin of the device.

BACKGROUND OF THE INVENTION

In resin-encapsulated integrated power devices, e.g., in so-called SIL (Single-In-Line) power devices, the semiconductor die is directly bonded onto the flat face of a heat sink metal baseplate, commonly a nickel or silver coated copper plate, which may or may not extend beyond the perimeter of the encapsulating resin body, which is molded on the face of the metal baseplate. Commonly, a projecting portion of the heat sink baseplate beyond the perimeter of the encapsulating resin body (or of an encapsulating metal enclosure) has the function of providing the means for mounting the device on an external heat sink or vice versa, with a good thermal coupling therebetween. In such a projecting portion of the baseplate one or more holes or slots are often formed for accommodating the stem of assembly screws or similar fastening means.

The metal pins for the electrical connection of the integrated circuit are derived from a die-stamped metal frame, commonly of copper, which may be coated with nickel, silver or gold. During the assembling stages of the device, the die-stamped metal frame is fastened to the heat sink metal baseplate by tab wedging or by laser welding, whereby at least one ground pin of the finished device is electrically in contact with the metallic heat sink baseplate, as is well known to the skilled technician. Therefore, the heat sink baseplate of the device is electrically connected through at least one of the pins of the device to a ground rail of the external printed card circuit. External heat sink plates mounted on the device are also customarily connected to a ground rail of the external printed card circuit.

The connection to ground of the metallic heat sink baseplate onto which the semiconductor die is directly bonded by means of a conductive adhesive, loaded with conductive metal powder (e.g., silver powder), or an eutectic lead and tin alloy, is commonly exploited for closing, through the heat sink baseplate itself, one or more electrical paths toward ground, by connecting with metal wires the respective metallicized pads for ground connection formed on the front of the die to the baseplate itself. When the die is relatively large, these ground connection wires tend to assume radiuses of curvature relatively small and because of the consequently increased mechanical stresses they often break near the welding point either during the resin encapsulation molding or during the normal operation of the device. Statistically their vulnerability is dramatically higher than that of the connection wires between the other pads of the device and the respective pins of the patterned metal frame.

SUMMARY OF THE INVENTION

An object of the present invention is the improvement of the reliability of the welded wire connections between ground connection pads of the semiconductor die and the metallic heat sink baseplate onto which the semiconductor die is bonded.

Another objective of the invention is to prevent flection stresses from being transmitted from the portion of the baseplate to which an external heat sink is mounted to the portion of the baseplate to which the semiconductor die is bonded. These objectives are fully met by making the electric connection by means of a metal wire welded at its extremities on a metallicized ground connection pad on the front of the semiconductor die and a purposely raised surface of the metallic heat sink baseplate which is substantially coplanar with the pad surface, respectively.

The surface of the metallic heat sink baseplate onto which one end of the connection wire is welded is the top surface of a raised portion or protrusion which is purposely formed on the otherwise flat surface of the baseplate in a position which is functionally adjacent or near one or more ground connections pads of the semiconductor die is bonded, may be substantially equal to the sum of the thickness of the semiconductor die and the layer of the conductive adhesive interposed between the die and the face of the metal heat sink baseplate. Of course a height of the raised portion slightly lower or slightly higher than the thickness of the semiconductor die and of the adhesive layer, may still be perfectly satisfactory, as far as this slight difference does not produce a substantial reduction of the radius of curvature of the connecting wire extending from the top surface of the raised portion of the metal plate and a ground connection pad present on the front of the semiconductor die. In other words, the relative coplanarity between the two surfaces to be connected by the metal wire is to be intended a condition which is inclusive also of minor differences of height between the two surfaces which do not negatively affect in a substantial manner the radius of curvature assumed by the connecting wire.

The raised portion may be produced on the otherwise flat surface of the metallic heat sink baseplate by stamping, during the die stamping of strips of baseplates from a copper plate or bar. Preferably, the raised portion is produced by a "deep drawing" or indenting action, by imposing, during the die stamping step of the baseplates, a punch of a suitable shape which acts on the metal in opposition to a recess which may be purposely formed on a die-stamping tool used for the die stamping.

The different aspects and advantages of the invention will become evident through the following description of a preferred embodiment and reference to the figures.

BRIEF DESCRIPTION OF THE DRAWINGS

FIG. 1 is a schematic plan view of a device of the present invention during an advanced phase of assembly;

FIG. 2 is a sectional view of the plane 2—2 indicated in FIG. 1.

DETAILED DESCRIPTION OF THE INVENTION

FIG. 1 is a fragmentary simplified plan view of a device made in accordance with the present invention, during an advanced phase of assemblying, preceding the molding of an encapsulating resin body. At this point of the fabrication process, the welding of the connecting wires between the pads of the front of the semiconductor die and the pins for the external connection of the device has been completed.

As may be observed in the figures, the die of semiconductor material 1 is bonded by means of a layer of conductive adhesive 2, on the face of a heat sink metal baseplate 3 (often referred to as "slug") of copper or another metal which is a good conductor of heat and electricity, most commonly of nickel coated copper. The metallic heat sink baseplate 3 has a projecting portion 4, which extends beyond the perimeter of the body of encapsulating resin 6, which is indicated in FIG. 2 by means of the shadow profile drawn with a dash line. The projecting portion 4 is provided with a hole 5 for accommodating the stem of a screw or of a similar means of fastening of an external heat sink, now shown in the figures.

Along the lower side of the baseplate 3, an indentation 7 is present, inside which a purposely shaped tab end 8 of a pin 10 is forcibly wedged. The tab end 8 is bent at about 90° in respect to the plane of the die stamped metal frame 9 in which the pins 10 of the device are patterned. In order to improve intelligibility of FIG. 2, the face of the underlying heat sink baseplate has been patterned in the plan view of FIG. 1. The die stamped assembly metal frame 9 is mechanically and electrically connected to the metallic heat sink baseplate 3 by wedging the tab end 8 of one of the patterned pins (the ground pin) into a slot or indentation 7 cut in the perimeter of the metallic baseplate 3. The inner ends of the patterned pins 10 are functionally disposed around the area of bonding the die 1 and are spaced from the face of the metal baseplate 3. Upon completing the resin encapsulation, the different pins 10 will be electrically separated one from the other by cutting with a cutting wheel the temporary bridge portions between adjacent pins. The pin of which a portion of its inner extremity has been bent to form the tab end 8 and wedged by plastic deformation inside the indentations 7 present along the side of the metallic heat sink baseplate 3, constitutes the ground connection pin of the integrated circuit.

Although the remaining inner flat portion of this ground connection pin remains available for establishing a connection with a relative ground pad 15 of the front of the die 1, by means of a wire 11, it is advantageous in many integrated circuits to form ground connections to the die 1. These connections are made using wires 11 connected to pins 10 functionally disposed along the perimeter of the die 1, where needed, and especially in diametrically opposite positions from the pin side of the die, in order to avoid the need of forming long ground connection lines on the die. These additional wire ground connections to ground connection pads of the die 1 would take place, in accordance with the prior art, by welding one end of the connecting wires on the surface of the metal heat sink baseplate 3. The difference in height between the die 1 and the baseplate 3 causes necessarily sharp curvature of the connecting wires from die ground pads 13 to the flat surface of the baseplate resulting in nonnegligible problems of reliability and overall yield.

By contrast, in accordance with the present invention, the heat sink baseplate 3 is provided with a purposely raised portion or ridge 12 in a position facing the side of the perimeter of the die opposite from the connecting tab end 8. Along the front of the die 1 at the end facing the ridge 12 metallized pads 13 for the ground connection are formed. The raised portion 12 has a top surface which may be advantageously flat and which is at the same height of the metallized pads 13 present on the front of the die 1. Connections are made between the die 1 and the baseplate 3 by welding wires 14 to the ground pads 13 and to the raised portion 12. In this way, the connection wires 14 assume a radius of curvature which is comfortably large by connecting points which are substantially coplanar, or almost so, among each other. This eliminates the drawback and the reliability problems of the prior art which appear substantially imputable to the relatively sharp bends of the connecting wires.

The ridge 12 is preferably formed on the face of the baseplate 3 during die stamping, by plastically deforming the metal by means of a punch and of a recessed counter tool suitably shaped for producing a partial deep drawing of the metal in the selected area. In the shown example, the deep drawing of the metal plate 3 is realized in a necked separation zone between the portion of the baseplate 3 onto which the semiconductor die is bonded and the portion 4 which will extend beyond the perimeter of the encapsulating body of resin 6, upon completion of the package, and which is provided with an assembly hole 5 for mounting an external heat sink. The elongated deep drawn ridge produced along this zone of reduced width for forming the desired raised portion 12 on the assembly face of the baseplate 3, also provides a zone of mechanical weakening (a line of discontinuity in the baseplate) which "separates" the externally projecting portion 4 of the baseplate from the central, die-assembly portion thereof. This zone off mechanical discontinuity or weakening is instrumental in providing a mechanical decoupling between the portion of the baseplate 3 onto which the die is bonded and the portion 4 extending outside the perimeter of the resin encapsulation body 6. This decoupling prevents the transmission of large flection stresses from the zone of the assembly hole 5 to the bond zone of the die 1 on the face of the baseplate 3 caused by mounting an external heat sink to assembly hole 5. The zone of mechanical weakening may extend for the entire width of the baseplate at the separation zone, or, as shown in the example, the deep drawn zone may extend only for a portion of the width of the baseplate.

Of course, additional ridges 12 may be formed on the assembly face of the metal baseplate 3, according to needs, also in different positions from the one depicted in the figure relative to the particular example shown.

The figures and discussion depict an embodiment of the invention, as implemented in manufacturing a semiconductor power device in a so-called Single-In-Line package, solely for illustrative and nonlimitative purposes. It will be appreciated that various modifications may be made without departing from the spirit and scope of the invention.

We claim:

1. A semiconductor device comprising a metal heat sink baseplate on a face of which the semiconductor die is bonded, a plurality of metal pins, the inner end of which is connected to a respective pad of the front of said semiconductor die by means of a metal wire, and wherein a metal wire connects at least a pad to said metal heat sink baseplate for establishing through the latter a ground connecting path, characterized by the fact that:

said heat sink metal baseplate is provided with a protrusion near said pad for ground connection; and said protrusion having a top surface at a height substantially equal to the height of said pad, each height being measured from the face of said baseplate, and said metal wire being welded onto said pad and onto said top surface of said protrusion wherein on said top surface of said protrusion a plurality of metal wires are welded, each being welded on a respective ground connection pad on the front of the semiconductor die for establishing through said metal heat sink baseplate a plurality of electrical ground connection paths.

2. A semiconductor device comprising a metal heat sink baseplate on a face of which the semiconductor die is bonded, a plurality of metal pins, the inner end of which is connected to a respective pad of the front of said semiconductor die by means of a metal wire, and wherein a metal wire connects at least a pad to said metal heat sink baseplate for establishing through the latter a ground connecting path, characterized by the fact that:

said heat sink metal baseplate is provided with a protrusion near said pad for ground connection; and said protrusion having a top surface at a height substantially equal to the height of said pad, each height being measured from the face of said baseplate, and said metal wire being welded onto said pad and onto said top surface of said protrusion wherein said metal heat sink baseplate has a portion extending beyond the perimeter of an encapsulating resin body molded thereon and said extending portion is provided with means for mechanically anchoring an external heat sink thereto and wherein said protrusion on the face of said metal baseplate is formed by deep-drawing the metal of the baseplate along an ideal separation line between said extending portion and the remaining portion of said baseplate for providing a mechanically weakened decoupling zone between the two portions of said metal baseplate in order to reduce transmission of flection stresses from said extending portion and the portion of said baseplate onto which the semiconductor die is bonded.

3. A semiconductor device comprising a grounded heat sink baseplate having a semiconductor die bonded thereto, the die having a front surface with one or more pads on the front surface, the baseplate having a protrusion with a top surface at a height substantially equal to the height of the one or more pads, wherein the baseplate has a portion extending from the raised protrusion and having a means for mechanically anchoring an external heat sink thereto, wherein the raised protrusion extends substantially across a connection region between the extending portion and the semiconductor die so as to provide a mechanically weakened zone substantially across the entire connecting region.

4. A method comprising a bonding a semiconductor die to a first portion of a baseplate, the baseplate having a second portion for attaching an external heat sink thereto, and mechanically deforming a baseplate connection area between the first and second portions such that the connection area is weakened with respect to the first and second portions such that flection stresses from the first portion to the second portion are substantially reduced wherein the step of mechanically deforming includes stamping the connection area to produce a raised protrusion having a height substantially equal to the height of the semiconductor die.

5. The method of claim 4, further comprising connecting a wire from the semiconductor die to the raised protrusion such that the wire has a relatively large radius of curvature to avoid mechanical stress in the wire.

6. A semiconductor device comprising:

a grounded heat sink base plate having a first portion with a semiconductor die attached thereto, the baseplate having a second portion for attaching a heat sink thereto, the baseplate having a connection area between the first and second portions, the connection area having a mechanically deformed raised protrusion, such that the connection area is weakened with respect to the first and second portions, thereby substantially reducing flection stresses from the first portion to the second portion.

7. The semiconductor device of claim 6 wherein the raised protrusion has a height substantially equal to the height of the semiconductor die.

8. The semiconductor device of claim 7, further comprising a wire connected from the semiconductor die to the raised protrusion, such that the wire has a relatively large radius of curvature to avoid mechanical stress in the wire.

9. The semiconductor device of claim 6 wherein the connection area is stamped to produce the raised protrusion having a height substantially equal to the height of the semiconductor die.

10. The semiconductor device of claim 6 wherein the raised protrusion extends across the entire width of the connection area.

11. The semiconductor device of claim 6 wherein the connection area has a reduced width when compared to the first and second portions of the base plate.

* * * * *

UNITED STATES PATENT AND TRADEMARK OFFICE
CERTIFICATE OF CORRECTION

PATENT NO. : 5,229,918

DATED : July 20, 1993

INVENTOR(S) : Pietro Della Bosca and Angelo Massironi

It is certified that error appears in the above-identified patent and that said Letters Patent is hereby corrected as shown below:

In column 6, claim 4, line 5, between "comprising" and "bonding", please delete "a".

Signed and Sealed this

Fifteenth Day of March, 1994

Attest:

BRUCE LEHMAN

Attesting Officer    Commissioner of Patents and Trademarks